(12) United States Patent
Wall et al.

(10) Patent No.: US 10,764,993 B2
(45) Date of Patent: Sep. 1, 2020

(54) METHOD AND APPARATUS FOR AFFIXING A FREQUENCY SELECTIVE SURFACE TO AN ANTENNA STRUCTURE

(71) Applicant: GM GLOBAL TECHNOLOGY OPERATIONS LLC, Detroit, MI (US)

(72) Inventors: Walter S. Wall, Santa Monica, CA (US); James H. Schaffner, Chatsworth, CA (US); Hyok Jae Song, Oak Park, CA (US); David S. Hammon, Simi Valley, CA (US); Timothy J. Talty, Beverly Hills, MI (US); Duane S. Carper, Davison, MI (US); Eray Yasan, Canton, MI (US)

(*) Notice: Subject to any disclaimer, the term of this patent is extended or adjusted under 35 U.S.C. 154(b) by 250 days.

(21) Appl. No.: 15/661,085

(22) Filed: Jul. 27, 2017

(65) Prior Publication Data
US 2018/0035535 A1     Feb. 1, 2018

Related U.S. Application Data

(60) Provisional application No. 62/369,441, filed on Aug. 1, 2016.

(51) Int. Cl.
| | | |
|---|---|---|
| H05K 1/02 | (2006.01) |
| H05K 3/30 | (2006.01) |
| H03H 7/01 | (2006.01) |
| H01Q 1/42 | (2006.01) |
| H01Q 1/32 | (2006.01) |
| H01Q 15/00 | (2006.01) |
| H05K 3/00 | (2006.01) |
| H05K 1/18 | (2006.01) |
| H05K 3/06 | (2006.01) |
| H05K 3/28 | (2006.01) |

(52) U.S. Cl.
CPC ......... *H05K 1/0243* (2013.01); *H01Q 1/3275* (2013.01); *H01Q 1/42* (2013.01); *H01Q 1/425* (2013.01); *H01Q 15/0006* (2013.01); *H03H 7/0138* (2013.01); *H05K 1/0236* (2013.01); *H05K 3/0058* (2013.01); *H05K 3/30* (2013.01); *H05K 1/189* (2013.01); *H05K 3/06* (2013.01); *H05K 3/284* (2013.01); *H05K 2201/0999* (2013.01); *H05K 2201/09409* (2013.01)

(58) Field of Classification Search
CPC .... H01Q 15/0006; H01Q 1/3275; H01Q 1/42; H01Q 1/425; H03H 7/0138
See application file for complete search history.

(56) References Cited

U.S. PATENT DOCUMENTS

| | | | | | |
|---|---|---|---|---|---|
| 5,633,105 A | * | 5/1997 | Jensen | ..... | G03F 1/68 |
| | | | | | 430/18 |
| 5,652,631 A | * | 7/1997 | Bullen | ..... | H01Q 1/281 |
| | | | | | 343/753 |
| 5,982,339 A | * | 11/1999 | Lalezari | ..... | H01Q 1/521 |
| | | | | | 343/705 |
| 6,323,825 B1 | * | 11/2001 | Zidek | ..... | H01Q 1/422 |
| | | | | | 343/753 |

(Continued)

*Primary Examiner* — Minh N Trinh
(74) *Attorney, Agent, or Firm* — Lorenz & Kopf, LLP (57) ABSTRACT

The present application electromagnetic signal filtering. More specifically, the application teaches a system and method for affixing a frequency selective surface to an existing antenna radome, such that unwanted signals are attenuated before reaching an antenna structure within the antenna radome.

13 Claims, 7 Drawing Sheets

(56) References Cited

U.S. PATENT DOCUMENTS

| | | | |
|---|---|---|---|
| 8,063,833 B2* | 11/2011 | Sievenpiper | H01Q 15/002 343/700 MS |
| 9,627,744 B2* | 4/2017 | Handy | H01Q 21/065 |
| 2006/0008600 A1* | 1/2006 | Appleton | B32B 27/06 428/34.1 |
| 2018/0035535 A1* | 2/2018 | Wall | H01Q 1/3275 |

* cited by examiner

METHOD AND APPARATUS FOR AFFIXING A FREQUENCY SELECTIVE SURFACE TO AN ANTENNA STRUCTURE

CROSS-REFERENCE TO RELATED APPLICATION

This application claims the benefit of U.S. Provisional Application No. 62/369,441, filed Aug. 1, 2016.

BACKGROUND

The present application generally relates to frequency selective surfaces. More specifically, the application teaches a method and apparatus for constructing conformal radome and antenna covers and fabrication and mounting of frequency selective surfaces (FSS) containing packaged components such as but not limited to surface mount inductors and capacitors as well as electromechanical resonators and/or equivalent coplanar frequency selective structures, such as open and shorted transmission line stubs.

Background Information

Often RF transmitters and receivers for cellular, entertainment, and navigation operate in dense and dynamic spectral environments with little frequency spacing between adjacent channels. When signals from neighboring channels are unintentionally picked up by a receiver, this creates noise and interference degrading the performance of the receiver. Due to this issue, filters to reject unwanted neighboring frequencies are an essential component of modern RF receivers, however adding new filters to existing wireless systems is often undesirable due to the degradation in performance due to added insertion loss and system noise figure in addition to added cost and/or effort associated with replacing components in the receiver. Frequency selective surfaces (FSS) provide a solution to this problem by allowing filter properties to be retrofit over existing antennas. Previous methods for fabricating FSSs assume that these structures are flat or planar such that they can be layered flush in between other planar materials and then bent or thermoformed to create a solid radome or cover. For applications which require FSS structures which are both high quality factor (Q) and conformal, the individual resonators which comprise the FSS can be loaded with high Q packaged components such as electromechanical resonators. Due to the finite height and sensitivity of these packaged components these types of FSS structures cannot be layered flush or thermoformed with other flat materials and therefore require alternative packaging techniques. Therefore, it would be desirable to have a method for constructing a cover which can be placed over existing antennas and radomes and which contains an FSS structure to address the above stated problems.

SUMMARY OF THE INVENTION

In accordance with an aspect of the present invention, an apparatus a first flexible substrate having a frequency selective design etched thereupon, a packaged component electrically coupled to a first side of said first flexible substrate, and an adhesive layer on a second side of the first flexible substrate such that said first flexible substrate may be affixed to an antenna radome.

In accordance with another aspect of the present invention, a method for etching a frequency selective design on a first flexible substrate, affixing a packaged component to a first side of said first flexible substrate, and forming the first flexible substrate to the shape of an antenna radome and placing adhesive on a second side of the first flexible substrate such that said first flexible substrate may be affixed to the antenna radome.

In accordance with another aspect of the present invention, a method for etching a frequency selective design on a first flexible substrate, a packaged component(s) such as electromechanical resonators, and/or surface mount inductors and capacitors and/or equivalent coplanar frequency selective structures, such as open and shorted transmission line stubs electrically coupled to a first side of said first flexible substrate, and forming the first flexible substrate to the shape of an antenna radome that is then places over antenna(s) to provide an antenna radome enclosure

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DETAILED DESCRIPTION

The following detailed description is merely exemplary in nature and is not intended to limit the disclosure or the application and uses thereof. Furthermore, there is no intention to be bound by any theory presented in the preceding background or the following detailed description.

Figure 1:
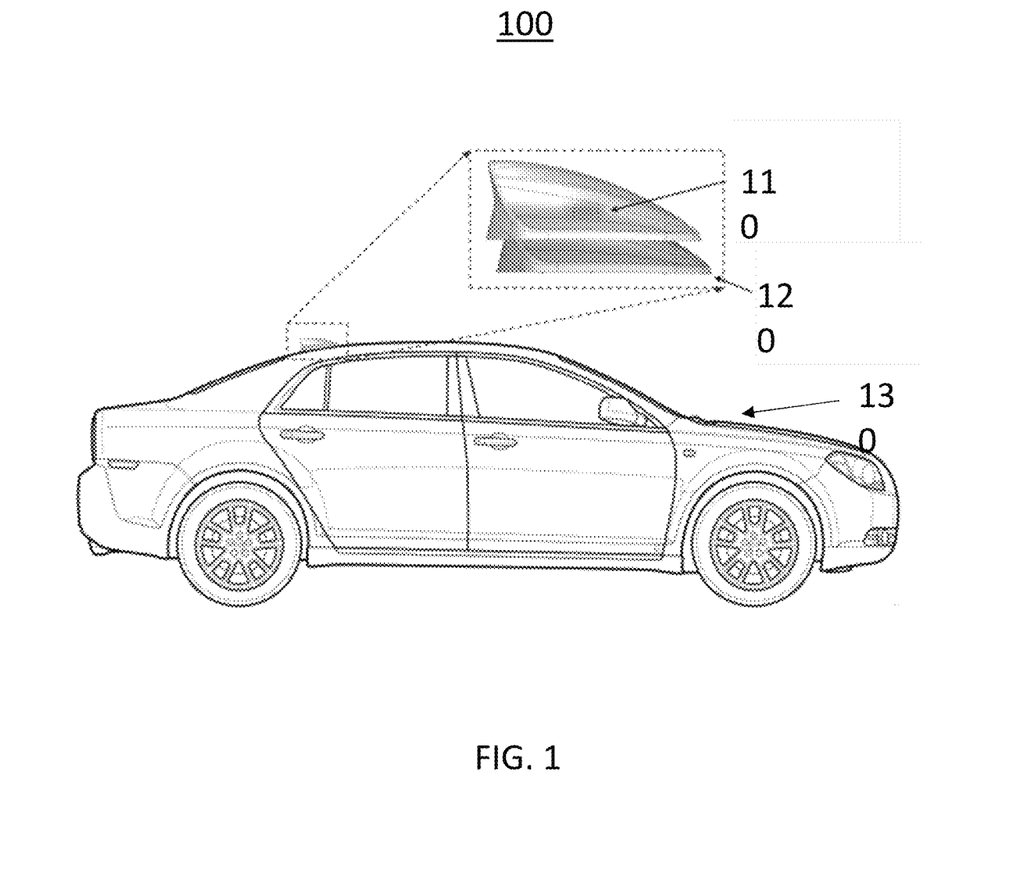
FIG. 1 shows an exemplary environment for the implementation of the disclosed system and method.

Turning now to FIG. 1, an exemplary environment 100 for the implementation of the disclosed system and method is shown. A FSS structure 110 is configured of fit directly over the top of an existing molded antenna structure 120. The FSS structure may be configured as a cover which can be placed over existing antennas and radomes, or as a flexible substrate with an adhesive backing that may be adhered to the antenna.

Figure 2:
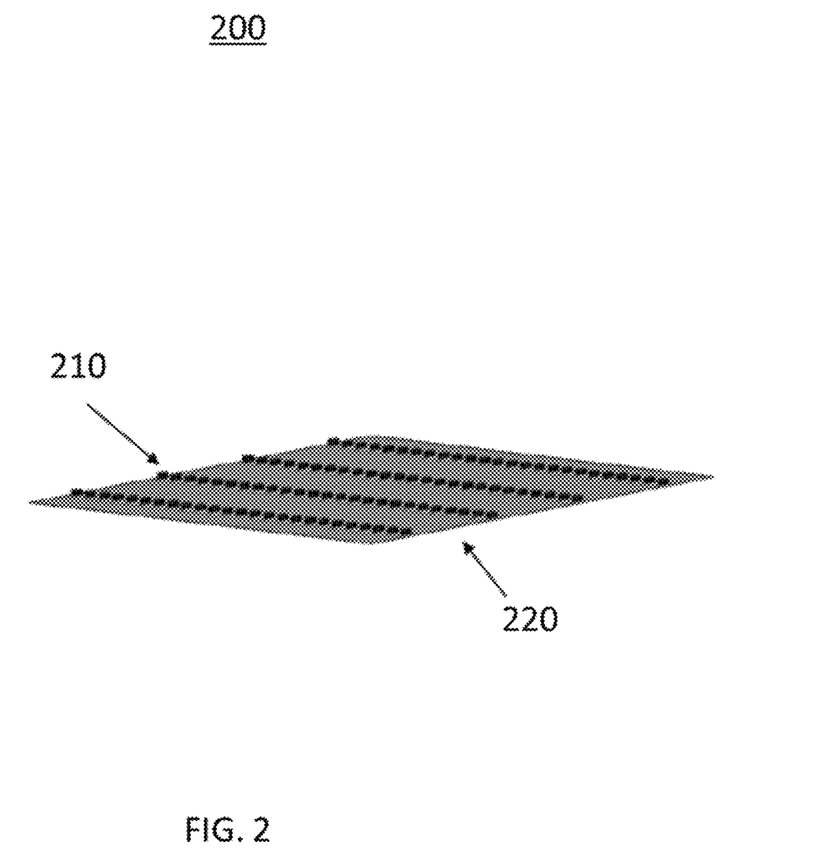
FIG. 2 shows an exemplary FSS structure.

Turning now to FIG. 2, an exemplary FSS structure 200 is shown. The FSS structure may be loaded with package components 210 such as high Q packaged components such as electromechanical resonators, and/or surface mount inductors and capacitors and/or equivalent coplanar frequency selective structures, such as open and shorted transmission line stubs.

Figure 3:
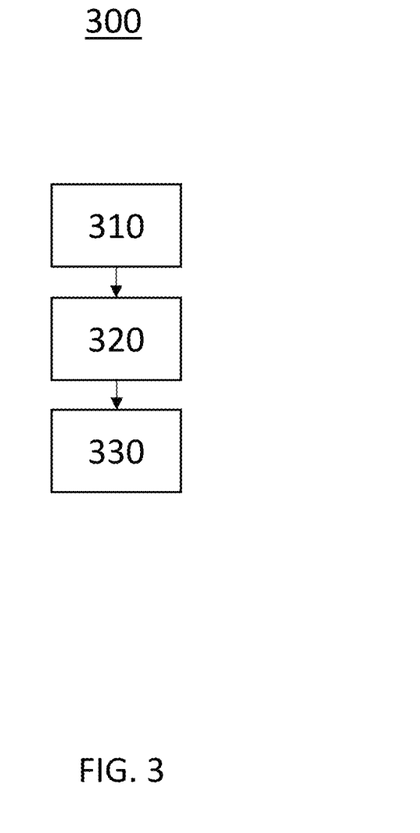
FIG. 3 shows an exemplary process for manufacturing the FSS.

Turning now to FIG. 3, an exemplary process for manufacturing the FSS is shown. The plurality of unit cells which comprise the FSS may be etched onto a thin flexible single-sided copper clad substrate 310 such as, but not limited to, Kapton or PET. One side of this substrate is coated with an adhesive material 220. The adhesive backing 220 on the substrate is used to mount the assembled FSS to an existing radome or antenna cover and may include graphics or other information and attached to the antenna radome similar to a decal. The FSS loaded with packaged components such as, but not limited to, high Q packaged components such as electromechanical resonators, and/or surface mount inductors and capacitors and/or equivalent coplanar frequency selective structures, such as open and shorted transmission line stubs which can be placed and soldered 320 on to the flexible single sided copper clad substrate.

The plurality of unit cells which comprise the FSS may be etched onto a thin flexible single-sided copper clad substrate such as but not limited to Kapton or PET. One side of this substrate may be coated with an adhesive material. The adhesive backing on the substrate may be used to mount the assembled FSS to a thermoformed plastic shell having the same shape and dimensions as the existing radome or antenna cover over which it is meant to be placed 330.

Figure 4:
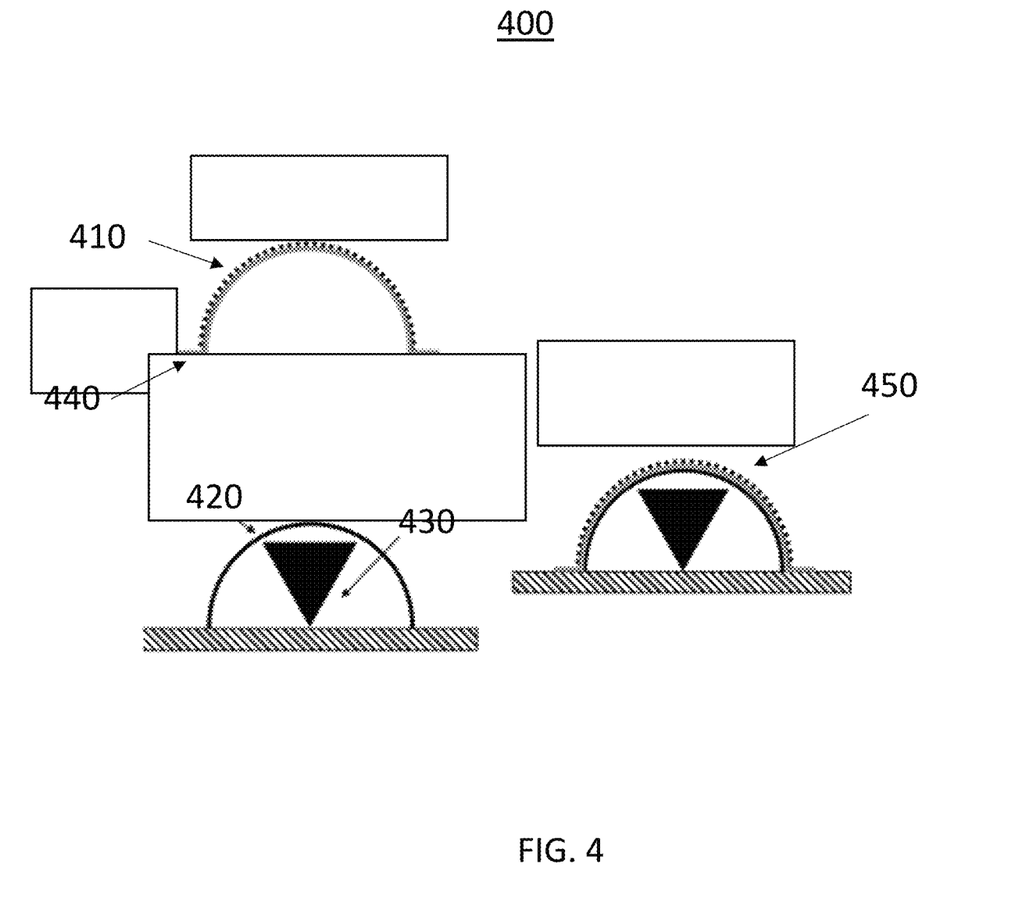
FIG. 4 shows an alternative method of adhering the FSS.

Turning now to FIG. 4, an alternative method of adhering the FSS is shown. Attachment of this FSS and plastic shell combination 410 over an existing radome 420 housing an antenna 430 may be accomplished by using adhesive material placed on a mounting foot 440. The purpose of this mount foot 440 is to provide a flat surface for attachment of the proposed invention to surrounding support material such as the roof of a car. An example of the adhered FSS to an existing radome 450 is shown. The FSS may be coated with the adhesive on the back of the radome, wherein the mounting foot 440 is employed for additional adhesion strength. Alternatively the FSS 410 may not have an adhesive applied to the surface and only to the mounting foot 440. In this example, the FSS 410 is adhered only by the mounting foot 440.

Figure 5:
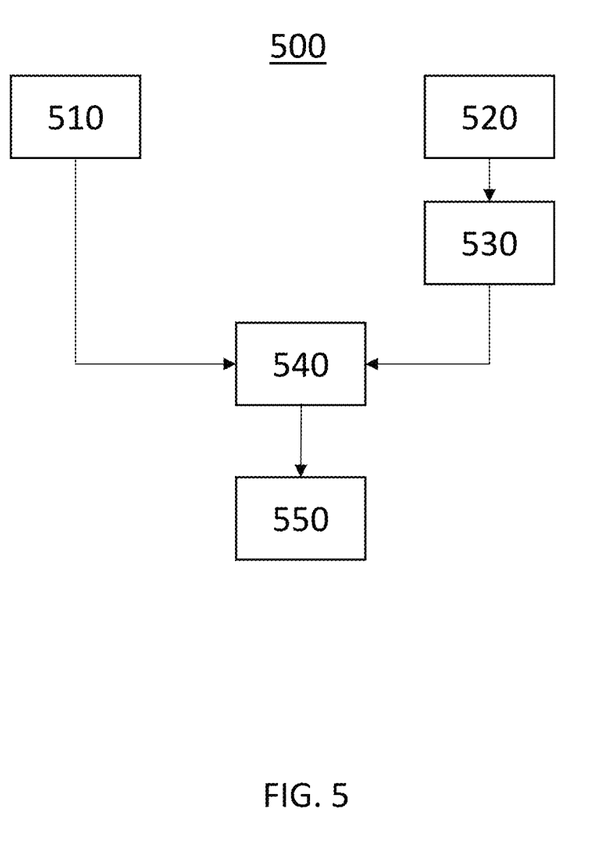
FIG. 5 shows an exemplary method for assembling an apparatus according to the present disclosure.

Turning now to FIG. 5, an exemplary method for assembling an apparatus according to the present disclosure is shown. An exemplary method of protecting the surface mount devices and the FSS is shown by first etching the FSS design on a flexible substrate with adhesive backing 520. The FSS is etched and, as needed, packaged components are then soldered onto the FSS 530. A thermoform solid antenna cover is created 510 to protect the components mounted on the FSS. The solid antenna cover is then affixed to on the FSS on the same side as the packaged components 540 to create a complete FSS structure. The complete FSS structure is then adhered to the existing radome/antenna 550 as described previously. Attachment of these two plastic shells can be accomplished by using adhesive backing or acoustic welding to bond the mounting feet on the base of each shell. The frequency selective surface (FSS) loaded with packaged components such as, but not limited to, high Q packaged components such as electromechanical resonators, and/or surface mount inductors and capacitors and/or equivalent coplanar frequency selective structures, such as open and shorted transmission line stubs. The plurality of unit cells which comprise the FSS are etched onto a thin flexible single-sided copper clad substrate such as but not limited to Kapton or PET. The reverse side of this substrate is coated with an adhesive material. The adhesive backing on the substrate may be used to mount the assembled FSS to an inner thermoformed plastic shell having the same shape and dimensions as the existing radome or antenna cover over which it is meant to be placed. Attachment of this FSS and plastic shell combination over an existing radome can be accomplished by using adhesive material placed on the bottom of the inner plastic shell mounting foot. The purpose of this mount foot is to provide a flat surface for attachment of the proposed invention to surrounding support material such as the roof of a car.

Figure 6:
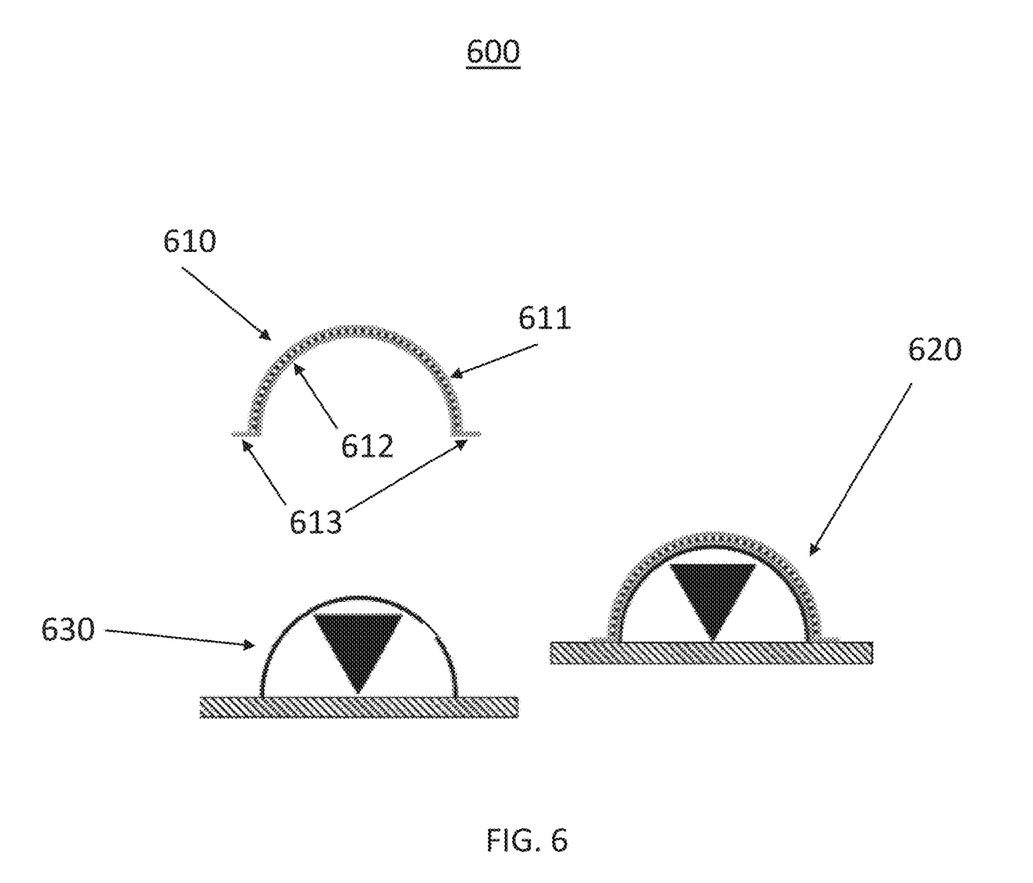
FIG. 6 shows an exemplary method of implementing the present disclosed system and method.

Turning now to FIG. 6, an exemplary method of implementing 600 the present disclosed system and method is shown. The FSS 610 is shown encased in both and outer thermoformed cover 611 and an inner thermoformed cover 612. The FSS 610 is shown with the optional mounting feet 613. The FSS 610 is configured to be conformed and adhered to the existing radome antenna structure 630. The FSS adhered to the radome antenna structure is shown 620.

Figure 7:
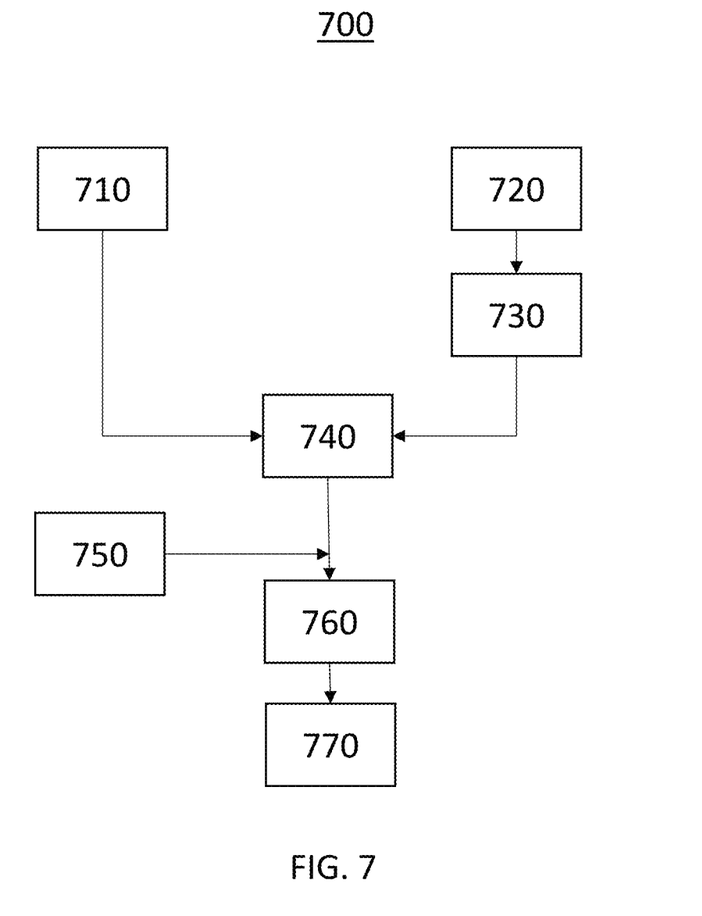
FIG. 7 shows a method for assembling a FSS with inner and outer thermoformed covers.

Turning now to FIG. 7, a method 700 for assembling a FSS with inner and outer thermoformed covers is shown. An exemplary method of protecting the surface mount devices and the FSS is shown by first etching the FSS design on a flexible substrate with adhesive backing 720. The FSS is etched and the packaged components are then soldered onto the FSS 730. A thermoform solid antenna inner cover is created 710 to protect the components mounted on the FSS. The solid antenna cover is then affixed to on the FSS on the same side as the packaged components 540 to create a semi complete FSS structure. A thermoformed outer cover is then created 750 to protect the outer surface of the FSS. The outer cover is then adhered to the semi complete FSS structure 760 to create a complete FSS structure. The complete FSS structure is then adhered to the existing radome/antenna 770 as described previously. Attachment of these two plastic shells can be accomplished by using adhesive backing or acoustic welding to bond the mounting feet on the base of each shell. The frequency selective surface (FSS) loaded with packaged components such as but not limited to surface mount inductors and capacitors and/or electromechanical resonators. The plurality of unit cells which comprise the FSS are etched onto a thin flexible single-sided copper clad substrate such as but not limited to Kapton or PET. The reverse side of this substrate is coated with an adhesive material. The adhesive backing on the substrate may be used to mount the assembled FSS to an inner thermoformed plastic shell having the same shape and dimensions as the existing radome or antenna cover over which it is meant to be placed. Attachment of this FSS and plastic shell combination over an existing radome can be accomplished by using adhesive material placed on the bottom of the inner plastic shell mounting foot. The purpose of this mount foot is to provide a flat surface for attachment of the proposed invention to surrounding support material such as the roof of a car.

It will be appreciated that while this exemplary embodiment is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium bearing the program and containing computer instructions stored therein for causing a computer processor to perform and execute the program. Such a program product may take a variety of forms, and the present disclosure applies equally regardless of the particular type of computer-readable signal bearing media used to carry out the distribution. Examples of signal bearing media include: recordable media such as floppy disks, hard drives, memory cards and optical disks, and transmission media such as digital and analog communication links

The invention claimed is:

1. A method comprising:
   providing a first flexible substrate having a first side and a second side and an outer thermoform cover;
   etching a frequency selective design on the first flexible substrate
   affixing the outer thermoform cover to the second side of the first flexible substrate;
   applying an adhesive material to the first side of the first flexible substrate; and
   adhering the first side of the first flexible substrate to an antenna radome.

2. The method of claim 1 further comprising:
   affixing a packaged component to the second side of the first flexible substrate.

3. The method of claim 2 further including affixing the outer thermoform cover to the second side of the first flexible substrate such that the packaged component is between the first flexible substrate and the outer thermoform cover.

4. The method of claim 3 wherein the outer thermoform cover is rigid.

5. The method of claim 2 wherein the first flexible substrate and the packaged component form a frequency selective surface.

6. The method of claim 1 further comprising:
   forming the first flexible substrate to the antenna radome.

7. The method of claim 1 wherein the frequency selective design is etched on the second side of the first flexible substrate.

8. A method comprising:
   providing a first flexible substrate having a first side and a second side, a packaged component, and an outer thermoform cover
   etching a frequency selective design on the first flexible substrate;
   affixing the packaged component to the first side of said first flexible substrate; and
   forming the first flexible substrate to a shape of an antenna radome and placing an adhesive on the second side of the first flexible substrate to affix the first flexible substrate to the antenna radome.

9. The method of claim 8 wherein an outer thermoform cover is affixed to the first side of the first flexible substrate wherein the packaged component is between the first flexible substrate and the outer thermoform cover.

10. The method of claim 9 wherein the outer thermoform cover is rigid.

11. The method of claim 8 wherein an inner thermoform cover is affixed between the second side of the first flexible substrate and the adhesive.

12. The method of claim 11 wherein the inner thermoform cover is rigid.

13. The method of claim 8 wherein the first flexible substrate and the packaged component form a frequency selective surface.

* * * * *